US008257599B2

(12) United States Patent
Sanbongi et al.

(10) Patent No.: US 8,257,599 B2
(45) Date of Patent: Sep. 4, 2012

(54) THERMAL HEAD MANUFACTURING METHOD

(75) Inventors: Norimitsu Sanbongi, Chiba (JP); Toshimitsu Morooka, Chiba (JP); Keitaro Koroishi, Chiba (JP); Noriyoshi Shoji, Chiba (JP); Yoshinori Sato, Chiba (JP)

(73) Assignee: Seiko Instruments Inc. (JP)

( * ) Notice: Subject to any disclaimer, the term of this patent is extended or adjusted under 35 U.S.C. 154(b) by 226 days.

(21) Appl. No.: 12/592,866

(22) Filed: Dec. 3, 2009

(65) Prior Publication Data

US 2010/0140215 A1 Jun. 10, 2010

(30) Foreign Application Priority Data

Dec. 5, 2008 (JP) ................................ 2008-311099

(51) Int. Cl.

| | |
|---|---|
| ***H01L 21/302*** | (2006.01) |
| ***H01L 21/461*** | (2006.01) |
| ***H01L 21/31*** | (2006.01) |
| ***H01L 21/469*** | (2006.01) |
| ***G01D 15/00*** | (2006.01) |
| ***G11B 5/127*** | (2006.01) |
| ***C03C 15/00*** | (2006.01) |
| ***C03C 25/68*** | (2006.01) |

(52) U.S. Cl. ................ 216/27; 216/58; 216/83; 216/97; 438/689; 438/700; 438/723; 438/765

(58) Field of Classification Search .................... 216/27
See application file for complete search history.

(56) References Cited

U.S. PATENT DOCUMENTS 6,184,913 B1 * 2/2001 Nagano et al. ................ 347/203
2007/0091161 A1 * 4/2007 Shoji et al. .................... 347/200

FOREIGN PATENT DOCUMENTS

JP 2007320197 A * 12/2007

* cited by examiner

*Primary Examiner* — Nadine G Norton
*Assistant Examiner* — Stephanie Duclair
(74) *Attorney, Agent, or Firm* — Adams & Wilks

(57) ABSTRACT

In a thermal head manufacturing method, at least one concave portion is formed on a surface of a first substrate, and a second substrate comprised of a first layer and a second layer that is denser and harder than the first layer is provided. The first and second substrates are bonded to one another so that the second layer of the second substrate covers the concave portion of the first substrate. The first layer of the second substrate is then etched until a surface of the second layer of the second substrate is exposed. At least one heating resistor is formed on the exposed surface of the second layer of the second substrate after the etching step so that the heating resistor is disposed over the concave portion of the first substrate.

15 Claims, 10 Drawing Sheets

THERMAL HEAD MANUFACTURING METHOD

BACKGROUND OF THE INVENTION

1. Field of the Invention

The present invention relates to a thermal head manufacturing method.

2. Description of the Related Art

There have been conventionally known thermal heads for use in thermal printers, which are often mounted to a small-sized information device terminal, typically, a small-sized handy terminal. A thermal head in a thermal printer prints an image on a heat-sensitive recording medium by selectively driving some of a plurality of heating elements based on printing data (see, for example, JP 2007-83532 A).

One way to improve the efficiency of a thermal head is to form a hollow portion (hollow heat insulating layer) on a layer below a heating portion of a heating resistor. Forming the hollow heat insulating layer on a layer below the heating portion makes the amount of upward-transferred heat, which is heat generated by the heating resistor and transferred to a wear-resistant layer above the heating portion, larger than the amount of downward-transferred heat, which is heat generated by the heating resistor and transferred to a heat storage layer below the heating portion, thus enhancing the efficiency of energy required during printing.

In such a thermal head that has a hollow structure, expanding the hollow portion by making thin the heat storage layer which supports the heating resistor enhances the heat insulation performance and improves the heating efficiency. On the other hand, making the heat storage layer thin reduces the strength for supporting the heating resistor. It is therefore important to determine a heat storage layer thickness that ensures reliability and durability while maintaining the heating efficiency.

JP 2007-83532 A describes a thermal head manufacturing method in which a thin glass plate that is thick enough for easy handling is bonded to a substrate, instead of a very thin glass plate which makes manufacture and handling difficult, and then the thin glass plate is processed by etching, polishing, or the like to form a very thin heat storage layer to a desired thickness.

However, considering the etching process capability and the ease of manufacture and handling, forming a heat storage layer of a desired thickness with precision by a conventional thermal head manufacturing method requires the substrate size to be smaller. This gives rise to a problem in that the size of a thermal head to be manufactured is limited. Another problem is that, in the case where a plurality of thermal heads are to be formed from a substrate, fewer thermal heads are obtained, which means lowered productivity and increased cost.

SUMMARY OF THE INVENTION

The present invention has been made in view of the circumstances described above, and it is therefore an object of the present invention to provide a thermal head manufacturing method that keeps the printing quality uniform and improves productivity while maintaining the heating efficiency and the strength against an external load.

In order to achieve the object described above, the present invention provides the following techniques.

According to an aspect of the present invention, there is provided a thermal head manufacturing method including: a concave portion forming step of forming a concave portion on one face of a supporting substrate; an upper substrate forming step of forming an upper substrate in which an etching layer and a non-etching layer are arranged in layers in a substrate thickness direction, the etching layer being etched at a predetermined etching rate, the non-etching layer being lower in etching rate than the etching layer; a bonding step of bonding the one face of the supporting substrate in which the concave portion has been formed in the concave portion forming step to a surface on a side of the non-etching layer of the upper substrate; a thinning step of etching the etching layer of the upper substrate which has been bonded to the supporting substrate in the bonding step; and a heating resistor forming step of forming a heating resistor across from the concave portion of the supporting substrate on the upper substrate which has been thinned in the thinning step.

The upper substrate placed immediately below the heating resistor functions as a heat storage layer. The concave portion of the supporting substrate is covered with the upper substrate, thereby forming a hollow portion between the supporting substrate and the upper substrate. According to the present invention, this hollow portion functions as a hollow heat insulating layer and prevents heat generated by a heating portion of the heating resistor from being transmitted to the supporting substrate through the heat storage layer. A thermal head high in heating efficiency is thus manufactured.

In this case, in the thinning step of this aspect of the present invention, the etching rate slows down at the time when the etching layer is etched away and the non-etching layer is reached. This facilitates the control of an etching amount, and hence a heat storage layer constituted of the non-etching layer of the upper substrate can be formed on the supporting substrate with ease and precision. A thermal head of uniform printing quality that maintains the heating efficiency and the strength against an external load is thus manufactured.

Further, with the etching process capability improved, the substrate size can be increased. This allows for an increase in thermal head size and an increase in number of thermal heads obtained from one substrate, thereby leading to improved productivity.

In the above-mentioned aspect-of the present invention, in the upper substrate forming step, the non-etching layer may be formed by modifying the composition of part of a substrate that is made of a material constituting the etching layer.

By the foregoing step, the present invention may include modifying the composition of the substrate such that the substrate is etched at a decreasing etching rate from a surface layer on one face of the substrate to a predetermined depth that matches a desired thickness dimension of the heat storage layer. Examples of the modification method that can be employed include ion implantation, heat treatment, laser irradiation, and a chemical treatment (glass reinforcement).

In the above-mentioned aspect of the present invention, in the upper substrate forming step, the non-etching layer may be formed by coating on one face of a substrate that is made of a material constituting the etching layer.

By the foregoing step, the present invention may include forming, by coating, a layer whose composition differs from that of the etching layer, namely, a layer lower in etching rate, on one face of the substrate to a desired thickness dimension of the heat storage layer.

According to another aspect of the present invention, there is provided a thermal head manufacturing method including: a concave portion forming step of forming a concave portion on one face of a supporting substrate; an upper substrate forming step of forming an upper substrate in which an etching layer, an etching barrier layer, and a coating layer are arranged in layers in a substrate thickness direction, the etching layer being made of a material that is etched by a predetermined etchant, the etching barrier layer being made of a material that is hardly etched by the predetermined etchant for the etching layer and being placed adjacent to the etching layer, the coating layer being made of the same material as the material of the etching layer and being placed adjacent to the etching barrier layer; a bonding step of bonding the one face of the supporting substrate in which the concave portion has been formed in the concave portion forming step to a surface on a side of the coating layer of the upper substrate; a first thinning step of etching the etching layer of the upper substrate which has been bonded to the supporting substrate in the bonding step; a second thinning step of removing the etching barrier layer of the upper substrate which has been thinned in the first thinning step; and a heating resistor forming step of forming a heating resistor across from the concave portion of the supporting substrate on the upper substrate which has been thinned in the second thinning step.

According to the present invention, the etching barrier layer is hardly etched by the etchant for the etching layer. Therefore, by making sure that the etching layer is not etched by an etchant that etches (removes) the etching barrier layer, the coating layer which is formed from the same material as the material of the etching layer is prevented from being etched by the etchant for the etching barrier layer.

Thus, with the upper substrate structured by laminating the etching layer, the etching barrier layer, and the coating layer in the order stated, the advance of etching is stopped at the time when the etching layer is etched away and the etching barrier layer is reached in the first thinning step. Further, etching in the second thinning step is stopped from advancing further at the time when the etching barrier layer is etched away and the coating layer is reached. This facilitates the control of etching amount, and hence a heat storage layer constituted of the coating layer of the upper substrate can be formed on the supporting substrate with ease and precision.

In the above-mentioned aspect of the present invention, in the concave portion forming step, a plurality of the concave portions may be formed on the one face of the supporting substrate, in the heating resistor forming step, the heating resistor may be formed for each of the plurality of the concave portions of the supporting substrate on the upper substrate which has been thinned in the thinning step, and the thermal head manufacturing method may further include a cutting step of cutting a thermal head aggregation, in which a plurality of the heating resistors have been formed on the upper substrate in the heating resistor forming step, into a plurality of thermal heads.

The thus structured thermal head manufactured by the method of the present invention improves productivity and reduces cost.

The manufacturing method of the present invention has an effect of maintaining the printing quality of the thermal uniform and improving productivity while maintaining the heating efficiency and the strength against an external load.

DETAILED DESCRIPTION OF THE PREFERRED EMBODIMENTS

First Embodiment

A manufacturing method A for a thermal head 1 according to a first embodiment of the present invention is described below with reference to the drawings.

Figure 1:
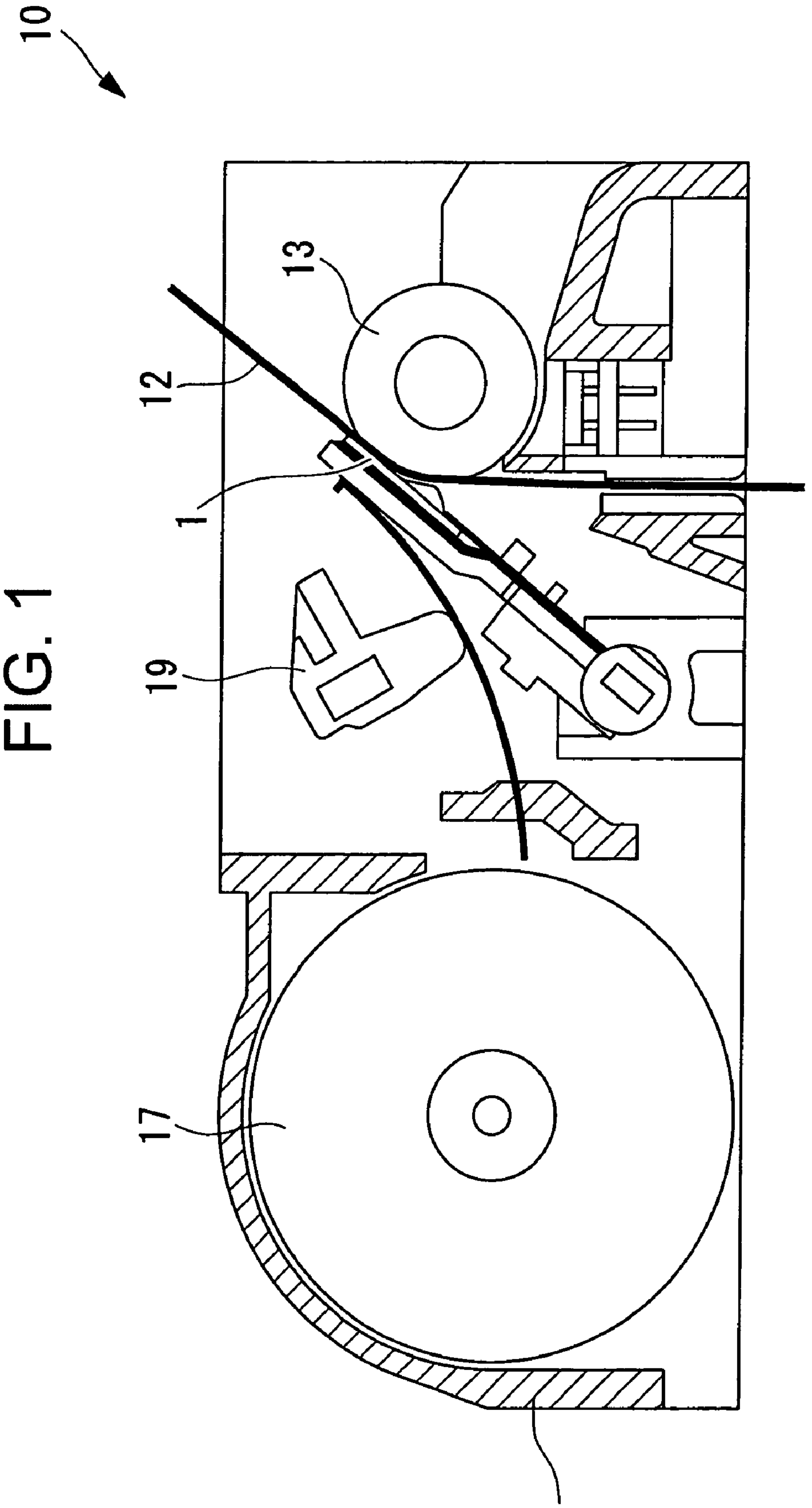
FIG. 1 is a schematic structural diagram of a thermal printer according to a first embodiment of the present invention.

The thermal head manufacturing method A according to this embodiment is for manufacturing the thermal head 1 for use in, for example, a thermal printer 10 illustrated in FIG. 1.

The thermal printer 10 includes: a main body frame 11; a platen roller 13 arranged horizontally; the thermal head 1 arranged oppositely to an outer peripheral surface of the platen roller 13; a heat dissipation plate 15 (see FIG. 3) supporting the thermal head 1; a paper feeding mechanism 17 for feeding between the platen roller 13 and the thermal head 1 an object to be printed such as thermal paper 12; and a pressure mechanism 19 for pressing the thermal head 1 against the thermal paper 12 with a predetermined pressing force.

The thermal head 1 and the thermal paper 12 are pressed against the platen roller 13 by the operation of the pressure mechanism 19. By this arrangement, a load of the platen roller 13 is applied to the thermal head 1 through an intermediation of the thermal paper 12.

The heat dissipation plate 15 is a plate-shaped member made of metal such as aluminum, a resin, ceramics, glass, or the like, and serves for fixation and heat dissipation of the thermal head 1.

Figure 2:
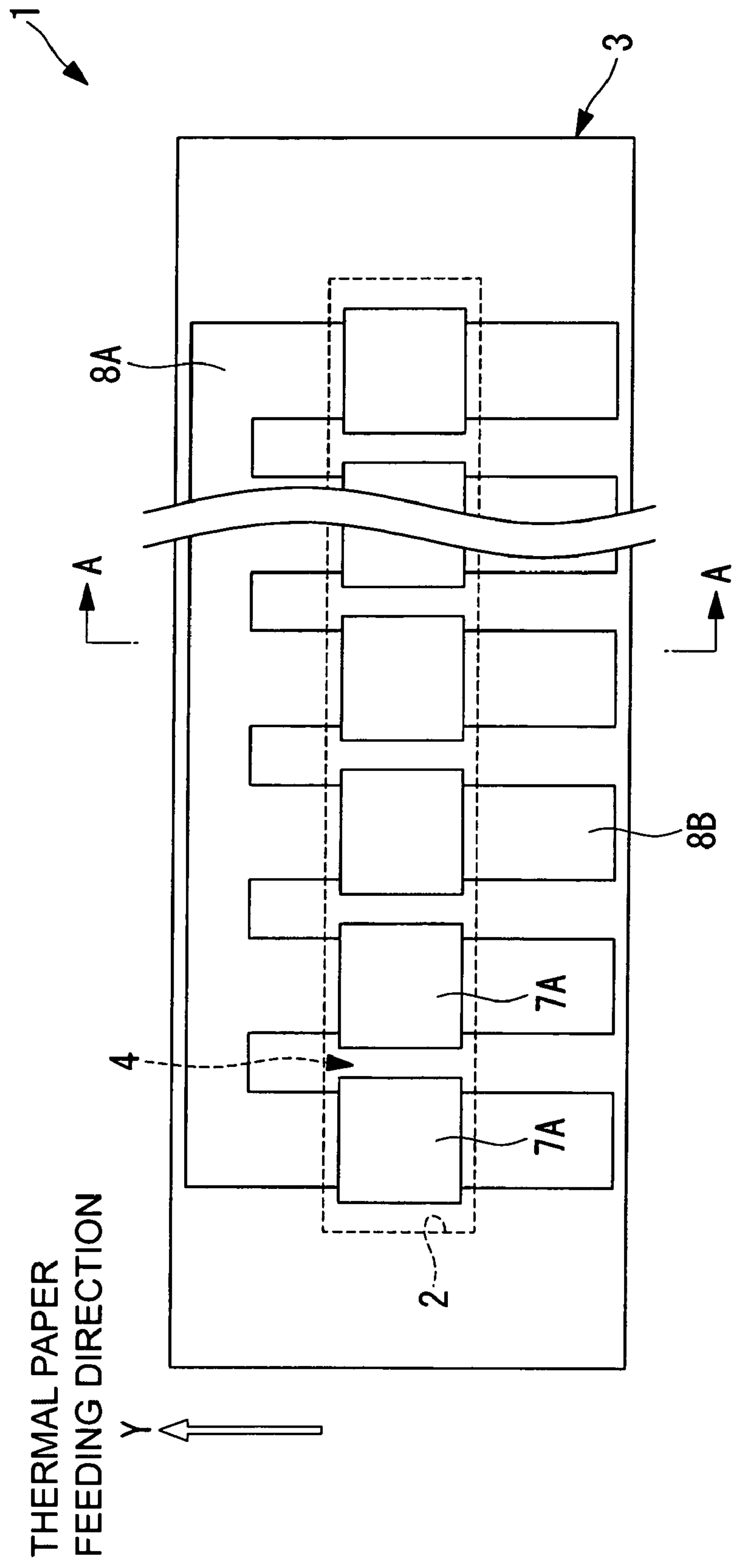
FIG. 2 is a plan view of a thermal head of FIG. 1 viewed from a protective film side.
Figure 3:
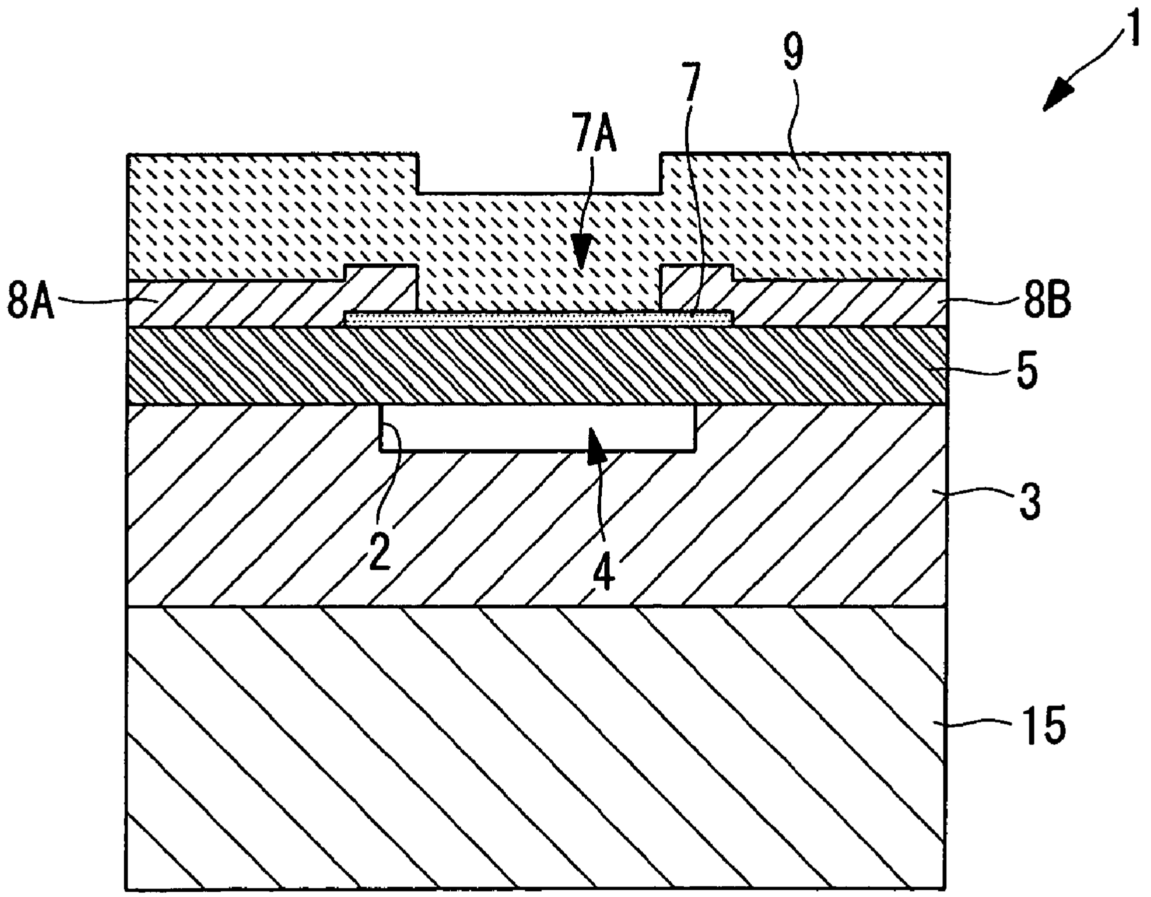
FIG. 3 is a sectional view (longitudinal sectional view) of the thermal head of FIG. 2 taken along an arrow A-A.

The thermal head 1 has a plate shape as illustrated in FIG. 2. As illustrated in FIG. 3 (sectional view taken along an arrow A-A of FIG. 2), the thermal head 1 includes: a rectangular supporting substrate 3 (first substrate) fixed on the heat dissipation plate 15; a heat storage layer 5 bonded onto one surface of the supporting substrate 3; a plurality of heating resistors 7 provided on the heat storage layer 5; electrode portions 8A, 8B connected to the heating resistors 7; and a protective film 9 covering the heating resistors 7 and the electrode portions 8A, 8B so as to protect the same from abrasion and corrosion. Note that, an arrow Y of FIG. 2 indicates a feeding direction of the thermal paper 12 by the paper feeding mechanism 17.

The supporting substrate 3 is, for example, an insulating substrate such as a glass substrate having a thickness of approximately 300 μm to 1 mm. On the face on the heat storage layer 5 side of the supporting substrate 3, there is formed a rectangular concave portion 2 extending in a longitudinal direction.

The heat storage layer 5 is formed of by an upper substrate 5*a* (second substrate) made of a glass material having a thickness of approximately 10 μm±3 μm. The heat storage layer 5 is bonded to one face of the supporting substrate 3, on which the concave portion 2 is formed, in a manner that hermetically seals the concave portion 2. With the heat storage layer 5 covering the concave portion 2, a hollow portion 4 is formed between the heat storage layer 5 and the supporting substrate 3.

The hollow portion 4 functions as a hollow heat insulating layer that prevents heat generated by the heating resistors 7 from entering the supporting substrate 3 from the heat storage layer 5, and has an uninterrupted structure facing all of the heating resistors 7. With the hollow portion 4 functioning as a hollow heat insulating layer, the amount of heat conducted upward above the heating resistors 7 to be used for printing or the like is made larger than the amount of heat conducted to the heat storage layer 5, which is below the heating resistors 7. The heating efficiency can thus be improved.

The heating resistors 7 are each provided so as to straddle the concave portion 2 in its width direction on an upper end surface of the heat storage layer 5, and are arranged at predetermined intervals in the longitudinal direction of the concave portion 2. In other words, each of the heating resistors 7 is provided to be opposed to the hollow portion 4 through an intermediation of the heat storage layer 5 so as to be situated above the hollow portion 4.

The electrode portions 8A, 8B serve to heat the heating resistors 7, and are constituted by a common electrode 8A connected to one end of each of the heating resistors 7 in a direction orthogonal to the arrangement direction of the heating resistors 7, and individual electrodes 8B connected to the other end of each of the heating resistors 7. The common electrode 8A is integrally connected to all the heating resistors 7, and the individual electrodes 8B are connected to the heating resistors 7, respectively.

When voltage is selectively applied to the individual electrodes 8B, current flows through the heating resistors 7 connected to the selected individual electrodes 8B and the common electrode 8A opposed thereto, whereby the heating resistors 7 are heated. In this state, the thermal paper 12 is pressed by the operation of the pressure mechanism 19 against the surface portion (printing portion) of the protective film 9 covering the heating portions of the heating resistors 7, whereby color is developed on the thermal paper 12 and printing is performed.

It is noted that of each of the heating resistors 7, an actually heating portion (hereinafter, referred to as "heating portion 7A") is a portion of each of the heating resistors 7 on which the electrode portions 8A, 8B do not overlap, that is, a portion of each of the heating resistors 7 which is a region between the connecting surface of the common electrode 8A and the connecting surface of each of the individual electrodes 8B and is situated substantially directly above the hollow portion 4.

Hereinafter, a manufacturing method A for the thermal head 1 constructed as described above (hereinafter, simply referred to as "manufacturing method A") is described.

Figure 4:
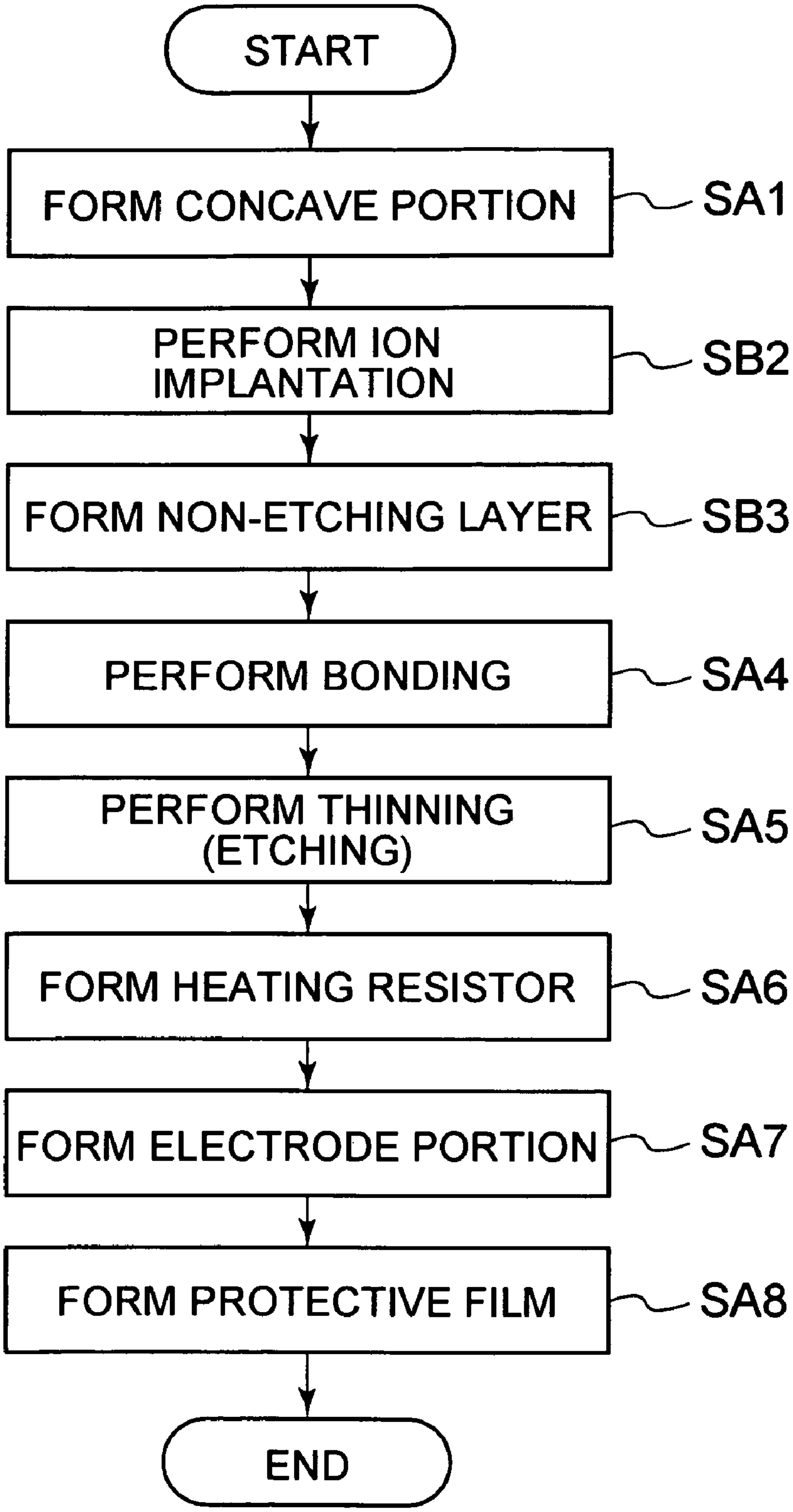
FIG. 4 is a flow chart of a manufacturing method according to the first embodiment of the present invention.

As illustrated in FIGS. 5A to 5E, the manufacturing method A according to this embodiment has a concave portion forming step in which the concave portion 2 is formed on one face of the supporting substrate 3, an upper substrate forming step in which the upper substrate 5*a* having a predetermined composition is formed, a bonding step in which the upper substrate 5*a* is bonded to the one face of the supporting substrate 3, a thinning step in which the upper substrate 5*a* bonded to the supporting substrate 3 is etched, and a heating resistor forming step in which the heating resistors 7 are formed on the thinned upper substrate 5*a*. A concrete description on each of the steps is given below with reference to the flow chart of FIG. 4.

Figure 5A:
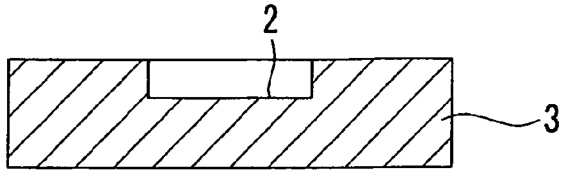
FIG. 5A is a longitudinal sectional view illustrating a concave portion forming step.

First, as illustrated in FIG. 5A, on one face of the supporting substrate 3, the concave portion 2 is formed so as to be opposed to a region in which the heating resistors 7 are formed (Step A1, concave portion forming step). The concave portion 2 is formed by performing, for example, sandblasting, dry etching, wet etching, or laser machining on the one face of the supporting substrate 3.

When the sandblasting is performed on the supporting substrate 3, the one face of the supporting substrate 3 is covered with a photoresist material, and the photoresist material is exposed to light using a photomask of a predetermined pattern, whereby there is cured a portion other than the region in which the concave portion 2 is formed.

After that, by cleaning the one face of the supporting substrate 3 and removing the photoresist material which is not cured, etching masks (not shown) having etching windows formed in the region in which the concave portion 2 is formed can be obtained. In this state, the sandblasting is performed on the one face of the supporting substrate 3, and the concave portion 2 having a predetermined depth is formed. It is desirable that the depth of the concave portion 2 be, for example, 10 μm or more and half or less of the thickness of the supporting substrate 3.

Further, when etching, such as dry etching and wet etching, is performed, as in the case of the sandblasting, the etching masks having the etching windows formed in the region in which the concave portion 2 is formed are formed on the surface of the supporting substrate 3. In this state, by performing the etching on the one face of the supporting substrate 3, the concave portion 2 having the predetermined depth is formed.

As the etching process, there are used, for example, wet etching using a hydrofluoric acid-based etchant or the like, and dry etching such as reactive ion etching (RIE) and plasma etching. Note that, as a reference example, in the case of a single-crystal silicon supporting substrate, there is performed wet etching using an etchant such as a tetramethylammonium hydroxide solution, a KOH solution, and a mixing solution of hydrofluoric acid and nitric acid.

Figure 5B:
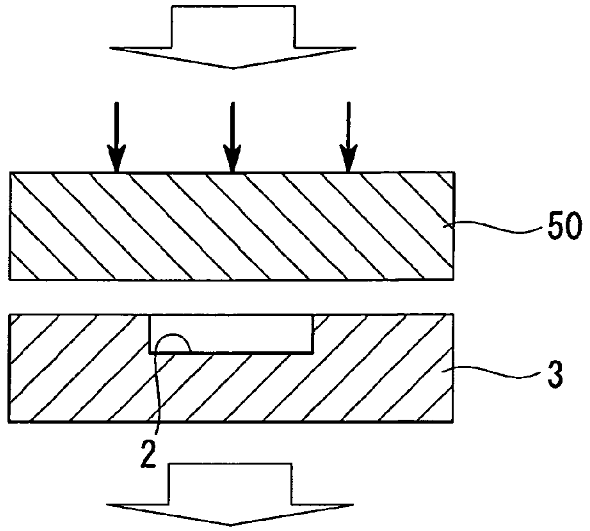
FIG. 5B is a longitudinal sectional view illustrating ion implantation to an original substrate in an upper substrate forming step.
Figure 5C:
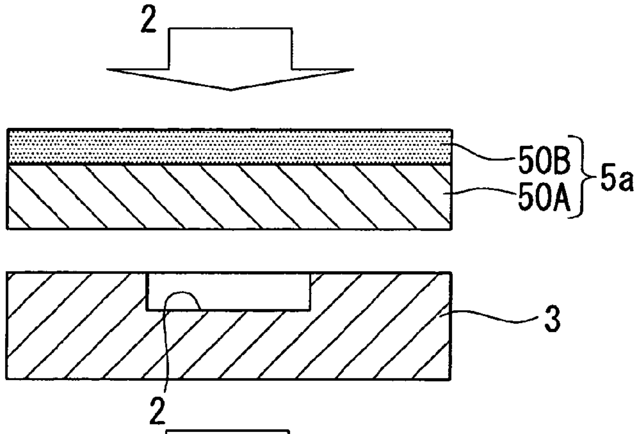
FIG. 5C is a diagram illustrating formation of a non-etching layer in the upper substrate forming step.

Next, the upper substrate 5*a* is formed as illustrated in FIGS. 5B and 5C (upper substrate forming step). The upper substrate 5*a* is formed by modifying part of an original substrate 50, which is constituted of an etching layer 50A (first layer) made of a glass material of predetermined composition, into a non-etching layer 50B (second layer), which is made of a glass material whose composition makes the non-etching layer 50B denser and harder than the etching layer 50A. The original substrate 50 is, for example, a glass substrate having a thickness of approximately 500 μm to 700 μm.

The original substrate 50 is modified by ion implantation, for example. First, an ion implantation apparatus (not shown) is used to implant nitrogen ions into one face of the original substrate 50 that is to be bonded to the supporting substrate 3 as illustrated in FIG. 5B (Step A2). The original substrate 50 is then modified to a depth of approximately 10 ?m (with a ±10% margin for fluctuations) from the surface layer into the non-etching layer 50B as illustrated in FIG. 5C (Step A3). The upper substrate 5*a* in which the etching layer 50A and the non-etching layer 50B are laminated in layers in the substrate thickness direction is thus formed. Other than nitrogen ions, silicon ions, phosphorus ions, oxygen ions, and the like may be employed.

The aforementioned difference in glass material composition makes an etching rate (second etching rate) at which the non-etching layer 50B is etched by a glass etchant lower than an etching rate (first etching rate) at which the etching layer 50A is etched by the glass etchant. For example, the modification preferably makes the etching rate of the non-etching layer 50B approximately five to ten times slower than that of the etching layer 50A.

Once the non-etching layer 50B is formed, the thickness dimension of the upper substrate 5*a* is measured. The target value (approximately 10 μm) and fluctuations (±10%) of the thickness dimension of the non-etching layer 50B are determined from pre-confirmed and preset ion implantation conditions (for example, applied voltage, repetitive pulse count, pulse width, gas species, gas flow rate, and working gas pressure).

Figure 5D:
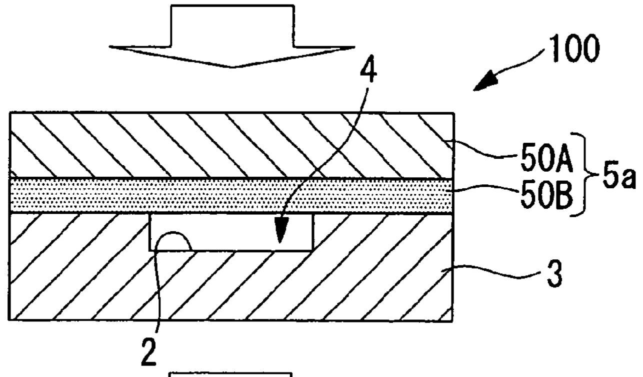
FIG. 5D is a longitudinal sectional view illustrating a bonding step.
Figure 5E:
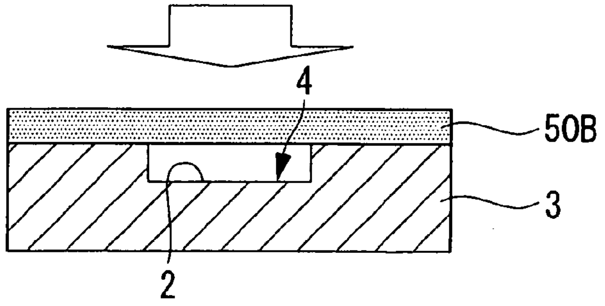
FIG. 5E is a longitudinal sectional view illustrating a thinning step.

Next, the etching mask is removed from the supporting substrate 3 and, as illustrated in FIG. 5D, one face of the supporting substrate 3 where the concave portion 2 is formed and a face of the upper substrate 5*a* on the side of the non-etching layer 50B are opposed to each other and directly bonded to each other by high-temperature fusion bonding (Step A4, bonding step). Covering one face of the supporting substrate 3 with the upper substrate 5*a*, specifically, covering the opening of the concave portion 2 with the upper substrate 5*a* creates the hollow portion (hollow heat insulating layer) 4 between the supporting substrate 3 and the upper substrate 5*a*. The thickness of the hollow heat insulating layer can be controlled easily by controlling the depth of the concave portion 2.

Here, it is difficult to manufacture and handle an upper substrate having a thickness of 100 μm or less, and such a substrate is expensive. Thus, instead of directly bonding an originally thin upper substrate onto the supporting substrate 3, the upper substrate 5*a* having a thickness facilitating manufacture and handling thereof in the bonding step may be bonded onto the supporting substrate 3, and then, the upper substrate 5*a* may be additionally processed by etching so that the substrate 5*a* has a desired thickness (Step A5, thinning step).

Figure 6:
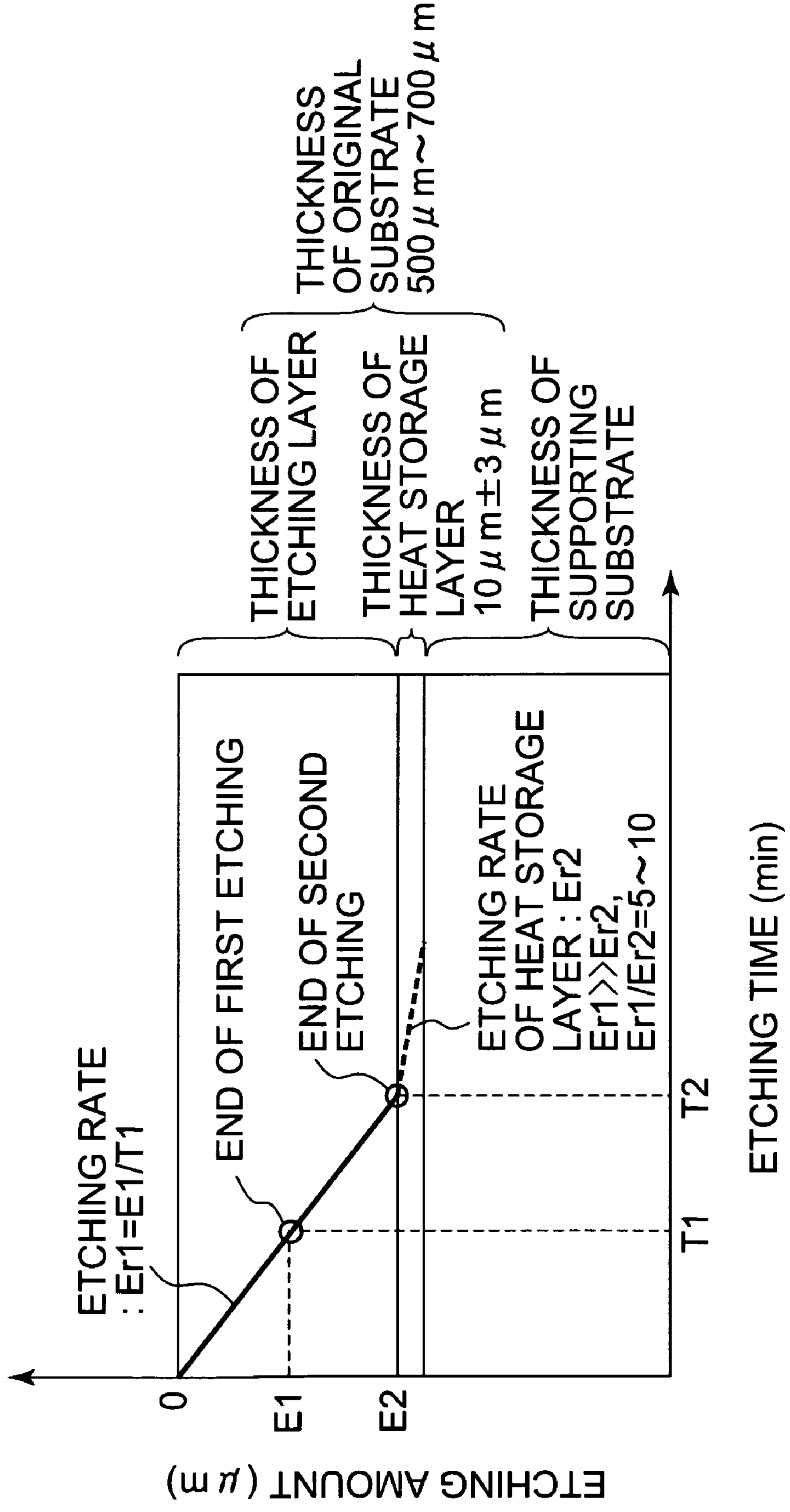
FIG. 6 is a diagram illustrating a relation between an etching amount (μm) and an etching time (min.) in the manufacturing method according to the first embodiment of the present invention.

Specifically, a substrate 100, which is obtained by bonding the upper substrate 5*a* and the supporting substrate 3 (hereinafter referred to as "bonded-together" substrate), is fixed on the side of the supporting substrate 3 to an etching jig (not shown) and masked. The entire bonded-together substrate 100 is then immersed in a glass etchant (not shown) to etch the etching layer 50A of the upper substrate 5*a* as illustrated in FIG. 6. In FIG. 6, the ordinate axis indicates the etching amount (μm) and the abscissa axis indicates the etching time (min.).

First, the upper substrate 5*a* is etched down to approximately half of its thickness (first etching). After the first etching, the bonded-together substrate 100 is taken out of the etchant and the thickness of the upper substrate 5*a* is measured. The difference between the thickness dimension of the upper substrate 5*a* that has been measured prior to the first etching and the post-first etching thickness dimension of the upper substrate 5*a* is used to calculate the etching amount. From the calculated etching amount and a time required for the first etching (first etching time), the etching rate is calculated.

Subsequently, an additional etching time (second etching time) to reach the non-etching layer 50B is calculated from the etching amount of the remaining etching layer 50A and from the etching rate that has just been calculated. The etching amount of the remaining etching layer 50A until the non-etching layer 50B is reached is calculated from the post-first etching thickness dimension of the upper substrate 5*a*. Etching is then resumed in the same manner as in the first etching (second etching).

In the second etching, when the etching layer 50A is completely etched away and the non-etching layer 50B is reached, the etching rate drops sharply. The non-etching layer 50B is therefore prevented from being etched significantly even if the calculated second etching time is exceeded a little. Thus, in this process, the non-etching layer 50B is able to remain substantially unetched since the etching rate of the non-etching layer is lower than the etching rate of the etching layer 50A.

Rather, a slight over-etching in terms of time absorbs fluctuations generated in previous etching, and hence the non-etching layer 50B is etched substantially to the target thickness dimension, or within a fluctuation margin from the target thickness dimension (10 μm±3 μm). The very thin heat storage layer 5 can thus be formed on one face of the supporting substrate 3 to a desired thickness easily and inexpensively.

Next, the heating resistors 7, the common electrode 8A, the individual electrodes 8B, and the protective film 9 are subsequently formed on the heat storage layer 5 (heating resistor forming step and the like). The heating resistors 7, the common electrode 8A, the individual electrodes 8B, and the protective film 9 can be manufactured by using a well-known manufacturing method for a conventional thermal head.

Specifically, in the heating resistor forming step, a thin film is formed from a heating resistor material such as a Ta-based material or a silicide-based material on the heat storage layer 5 by a thin film forming method such as sputtering, chemical vapor deposition (CVD), or vapor deposition. The thin film of a heating resistor material is molded by lift-off, etching, or the like to form the heating resistors 7 having a desired shape (Step A6).

Subsequently, as in the heating resistor forming step, the film formation with use of a wiring material such as Al, Al—Si, Au, Ag, Cu, and Pt is performed on the heat storage layer 5 by using sputtering, vapor deposition, or the like. Then, the film thus obtained is formed by lift-off or etching, or the wiring material is screen-printed and is, for example, burned thereafter, to thereby form the common electrode 8A and the individual electrodes 8B which have the desired shape (Step A7). Note that, the heating resistors 7, the common electrode 8A, and the individual electrodes 8B are formed in an appropriate order.

In the patterning of a resist material for the lift-off or etching for the heating resistors 7 and the electrode portions 8A, 8B, the patterning is performed on the photoresist material by using a photomask.

After the formation of the heating resistors 7, the common electrodes 8A, and the individual electrodes 8B, the film formation with use of a protective film material such as $SiO_2$, $Ta_2O_5$, SiAlON, $Si_3N_4$, or diamond-like carbon is performed on the heat storage layer 5 by sputtering, ion plating, CVD, or the like, whereby the protective film 9 is formed (Step A8). Thus, the thermal head 1 illustrated in FIG. 2 and FIG. 3 is manufactured.

As has been described, in the manufacturing method A for the thermal head 1 according to this embodiment, the hollow portion 4 functions as a hollow heat insulating layer and prevents heat generated by the heating portions 7A of the heating resistors 7 from being transmitted to the supporting substrate 3 through the heat storage layer 5. The manufactured thermal head 1 therefore has a high heating efficiency.

In the thinning step of the manufacturing method A, the etching rate slows down at the time when the etching layer 50A is completely etched away and the etching layer 50B is reached, which facilitates the control of etching amount. The heat storage layer 5 can therefore be formed on the supporting substrate 3 to a desired thickness with ease and precision. This enables the manufactured thermal head 1 to keep the printing quality uniform while maintaining the heating efficiency and the strength against an external load.

Further, with the etching process capability improved, the substrate size can be increased. This allows for an increase in size of the thermal head 1 and an increase in number of thermal heads 1 obtained from one substrate, and leads to improved productivity.

While this embodiment employs ion implantation as the method of modifying the original substrate 50, other methods including heat treatment, laser irradiation, and chemical treatment (glass reinforcement) may be used instead. For instance, in the case of heat treatment, the original substrate 50 is heated to its softening temperature and then rapidly cooled. As a result, compressive stress is generated on the surface (within 10 μm deep) of the original substrate 50 and modifies the surface. In the case of chemical treatment, the original substrate 50 is immersed in a salt ($KNO_3$) melted at a high temperature to substitute Na and K in the original substrate 50 and thereby generate compressive stress on the surface (within 10 μm deep) of the original substrate 50 with which the surface is modified.

Second Embodiment

Figure 7:
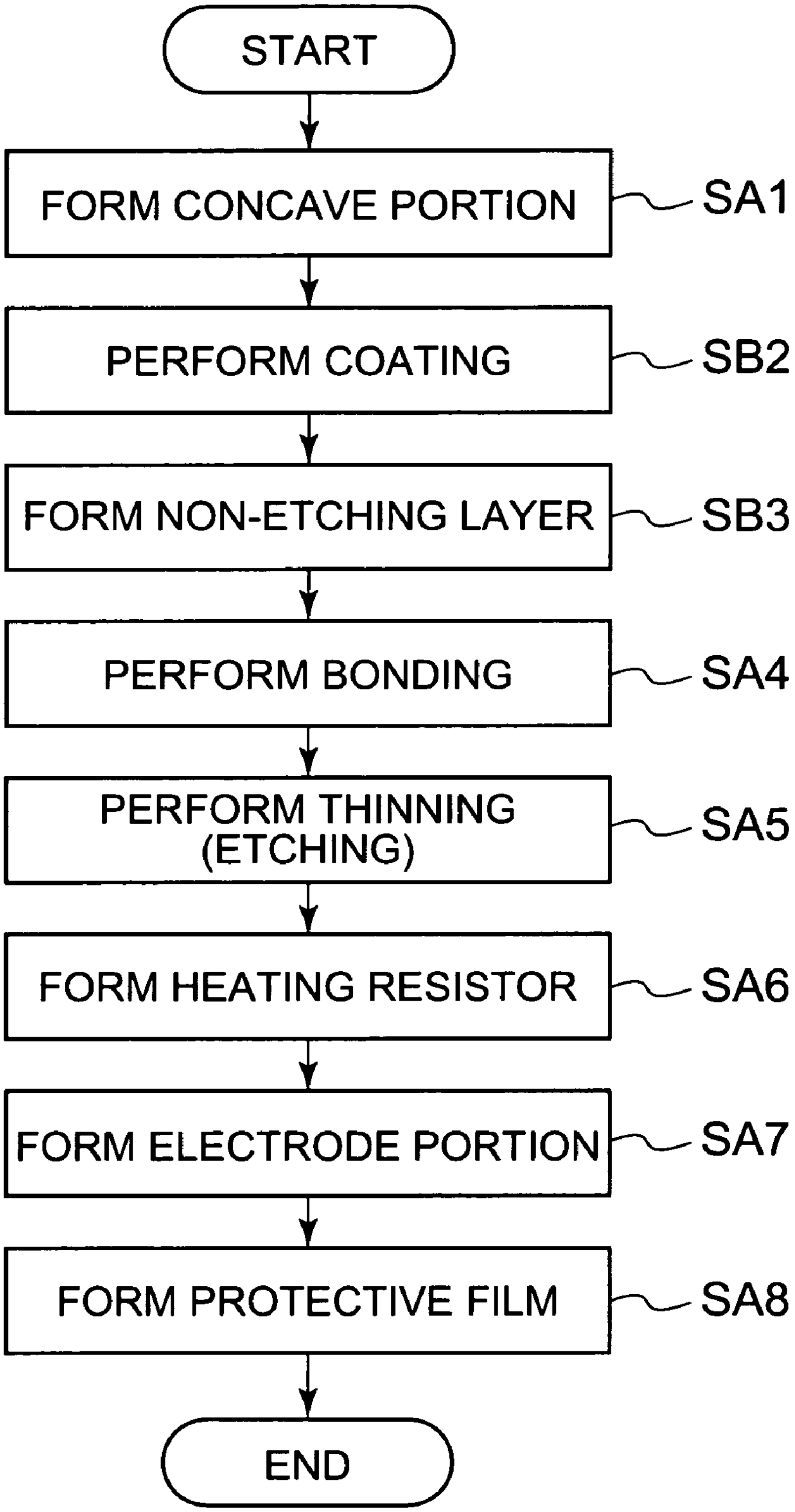
FIG. 7 is a flow chart illustrating a manufacturing method according to a second embodiment of the present invention.

A manufacturing method B for the thermal head 1 (hereinafter simply referred to as "manufacturing method B") according to a second embodiment of the present invention is described below with reference to the flow chart of FIG. 7.

As illustrated in FIGS. 8A to 8E, the manufacturing method B according to this embodiment differs from the first embodiment in that coating is used instead of composition modification to form an upper substrate 105*a* in the upper substrate forming step.

In the following description of this embodiment, components common to the thermal head 1 and manufacturing method A of the first embodiment are denoted by the same reference numerals and symbols in order to omit repetitive descriptions.

In the manufacturing method B, an original substrate 150 is constituted of an etching layer 150A, which is made of a glass material having a predetermined composition, and coated with a non-etching layer 150B, which is made of a glass material whose composition makes the non-etching layer 150B denser and harder than the etching layer 150A, to form the upper substrate 105*a* (upper substrate forming step). The original substrate 150, the etching layer 150A, the non-etching layer 150B, and the upper substrate 105*a* correspond to the original substrate 50, the etching layer 50A, the non-etching layer 50B, and the upper substrate 5*a* in the manufacturing method A, respectively.

Figure 8A:
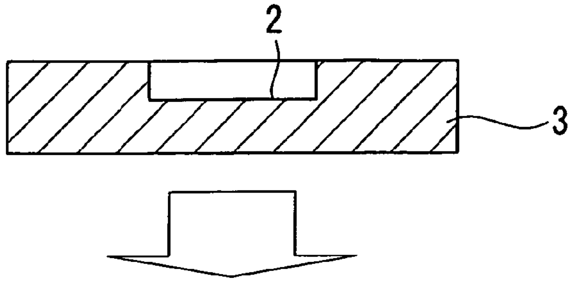
FIG. 8A is a longitudinal sectional view illustrating a concave portion forming step.
Figure 8B:
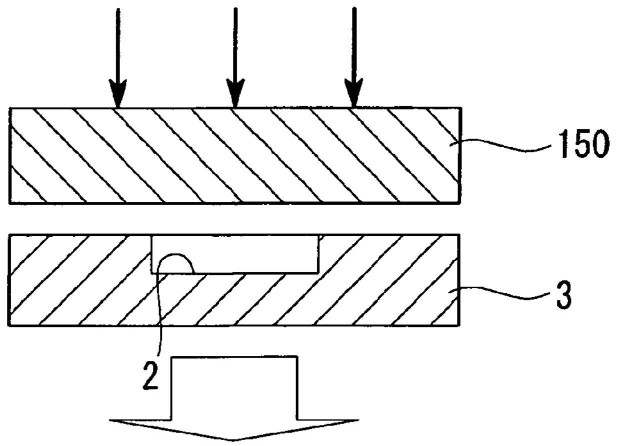
FIG. 8B is a longitudinal sectional view illustrating coating on an original substrate in an upper substrate forming step.
Figure 8C:
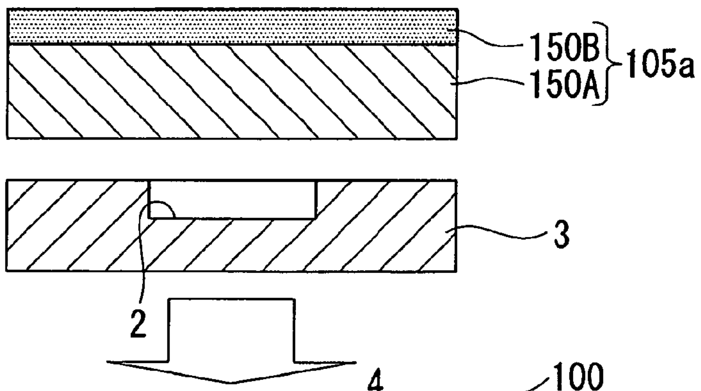
FIG. 8C is a diagram illustrating formation of a non-etching layer in the upper substrate forming step.
Figure 8D:
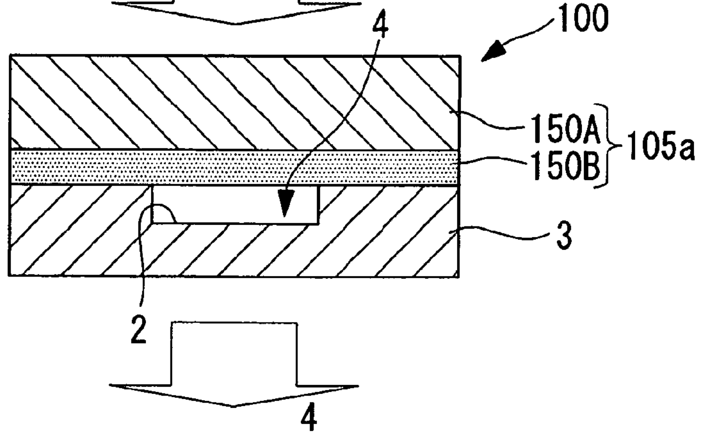
FIG. 8D is a longitudinal sectional view illustrating a bonding step.
Figure 8E:
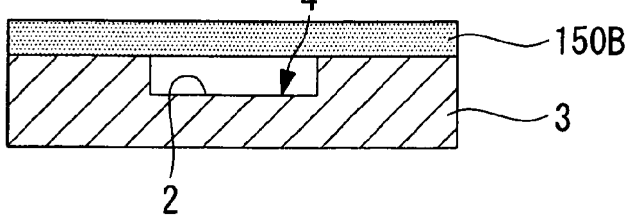
FIG. 8E is a longitudinal sectional view illustrating a thinning step.

The coating is accomplished by sputtering. First, a sputtering apparatus (not shown) is used to deposit a glass substance that is a material constituting the non-etching layer 150B on one face of the original substrate 150 that is to be bonded to the supporting substrate 3 as illustrated in FIG. 8B (Step B2), and the non-etching layer 150B is formed by coating to a target thickness dimension as illustrated in FIG. 8C (Step B3). The upper substrate 105*a* in which the etching layer 150A is coated with the non-etching layer 150B is thus formed.

Once the non-etching layer 150B is formed, the thickness dimension of the upper substrate 105*a* is measured. The target value (approximately 10 μm) and fluctuations (±10%) of the thickness dimension of the non-etching layer 150B are determined from pre-confirmed and preset sputtering conditions (for example, applied voltage, applied current, target species, gas flow rate, and gas pressure). The original substrate 150 is, for example, a non-alkaline glass substrate and, for the non-etching layer 150B, Pyrex (registered trademark) glass is preferably employed.

Subsequent steps including the bonding step, the thinning step, and the heating resistor forming step are the same as in the manufacturing method A, and their descriptions are omitted.

While this embodiment employs sputtering as the method of coating, other methods including vacuum evaporation, CVD, printing, spraying, dipping, electroless plating, and the sol-gel process may be employed instead. For instance, in the case of vacuum evaporation, a substance is heated in vacuum to be vaporized and deposited on a surface of the original substrate 150, thereby forming the non-etching layer 150B. In the case of CVD, a metal compound heated to a high temperature that turns the metal compound into vapor is allowed to chemically react on a surface of the original substrate 150, thereby forming the non-etching layer 150B. In the case of dipping, an organic metal compound is uniformly adhered to a surface of the original substrate 150, and then heated and dried to form the non-etching layer 150B. In the case of printing, a glass frit is dissolved in a solvent to be printed on a surface of the original substrate 150 with the use of a screen (plate) and dried, and then the print is heated and melted to form the non-etching layer 150B.

The original substrate 150 in this embodiment is constituted of the etching layer 150A, which is made of a glass material. Alternatively, the original substrate 150 may be constituted of the etching layer 150A that is made of other materials than glass. Examples of other employable materials than glass include metal (for example, aluminum or copper) and silicon.

Third Embodiment

Figure 9:
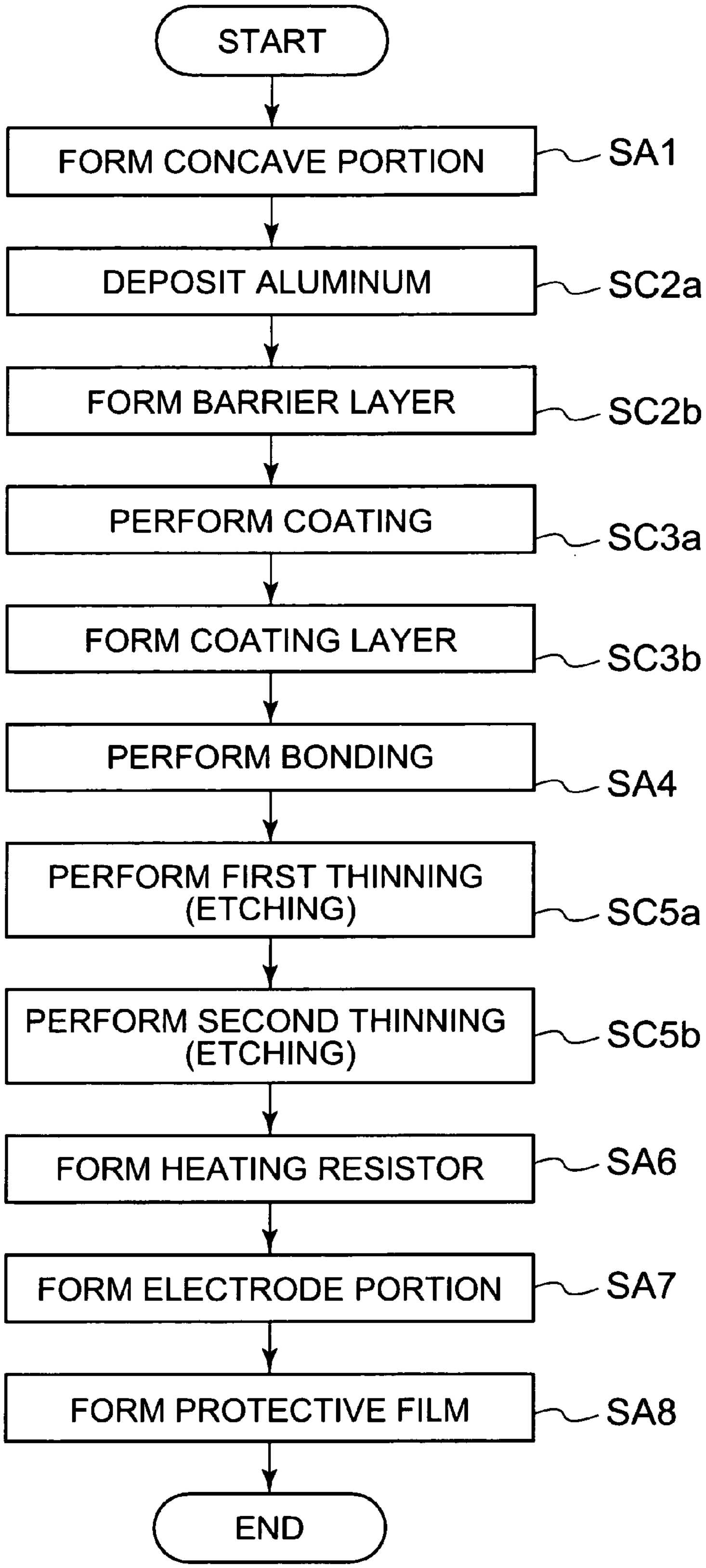
FIG. 9 is a flow chart illustrating a manufacturing method according to a third embodiment of the present invention.

A manufacturing method C for the thermal head 1 (hereinafter simply referred to as "manufacturing method C")

according to a third embodiment of the present invention is described below with reference to a flow chart of FIG. 9.

As illustrated in FIGS. 10A to 10G, the manufacturing method C according to this embodiment differs from the first embodiment in that coating is used instead of composition modification to form an upper substrate 205*a* in the upper substrate forming step, and that there are a first thinning step and a second thinning step.

In the following description of this embodiment, components common to the thermal heads 1 according to the first embodiment and the second embodiment and steps common to the manufacturing methods A and B are denoted by the same reference numerals and symbols as in the first and second embodiments in order to omit repetitive descriptions.

In the manufacturing method C, an original substrate 250 is constituted of an etching layer 250A, which is made of a glass material having a predetermined composition, and coated with an etching barrier layer 250C, which is made of a material completely different from that of the etching layer 250A, and the etching barrier layer 250C is coated with a coating layer 250B, which is made from the same glass material that is used for the supporting substrate 3 and the original substrate 250, to form the upper substrate 205*a* (upper substrate forming step).

Figure 10A:
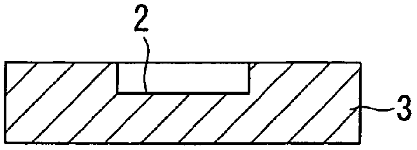
FIG. 10A is a longitudinal sectional view illustrating a concave portion forming step.
Figure 10B:
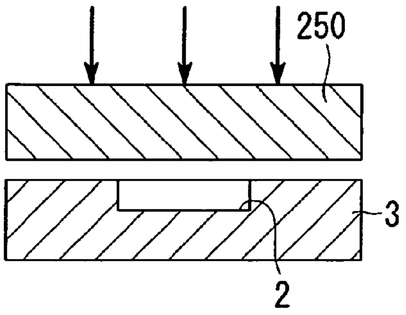
FIG. 10B is a longitudinal sectional view illustrating aluminum deposition on an original substrate in an upper substrate forming step.
Figure 10C:
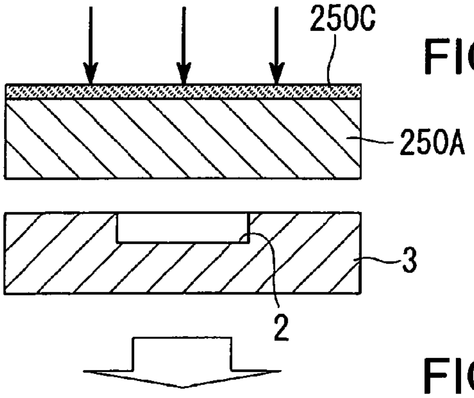
FIG. 10C is a diagram illustrating formation of a barrier layer in the upper substrate forming step.

The coating is accomplished by sputtering. First, a sputtering apparatus is used to deposit, for example, aluminum on one face of the original substrate 250 that is to be bonded to the supporting substrate 3 as illustrated in FIG. 10B (Step C2*a*), and the etching barrier layer 250C as thin as approximately 1 μm is formed by coating as illustrated in FIG. 10C (Step C2*b*).

Figure 10D:
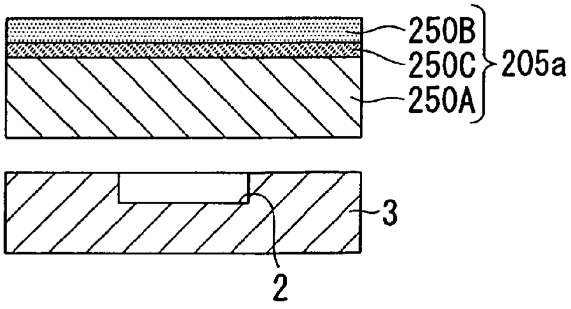
FIG. 10D is a longitudinal sectional view illustrating formation of a coating layer on the original substrate in the upper substrate forming step.

Subsequently, non-alkaline glass, for example, is deposited on the etching barrier layer 250C (Step C3*a*) and, as illustrated in FIG. 10D, the coating layer 250B is formed by coating to a target thickness dimension (approximately 10 μm) (Step C3*b*). The etching layer 250A, which constitutes the original substrate 250, the etching barrier layer 250C, and the coating layer 250B are thus laminated in layers in the substrate thickness direction in the stated order, thereby forming the upper substrate 205*a*.

Made of different materials as described above, the etching barrier layer 250C is not etched by a glass etchant but is etched by an aluminum etchant, which is not capable of etching glass, whereas the etching layer 250A and the coating layer 250B are etched by the glass etchant.

Once the etching barrier layer 250C and the coating layer 250B are formed, the thickness dimension of the upper substrate 205*a* is measured. In the coating by sputtering, a desired thickness may be obtained by a conversion from the sputtering time with the use of a sputtering rate that is set by determining in advance sputtering conditions such that the target thickness dimension (approximately 10 μm) is reached. Thickness fluctuations may be contained approximately within ±10% (±1 μm), depending on the performance of the sputtering apparatus.

Figure 10E:
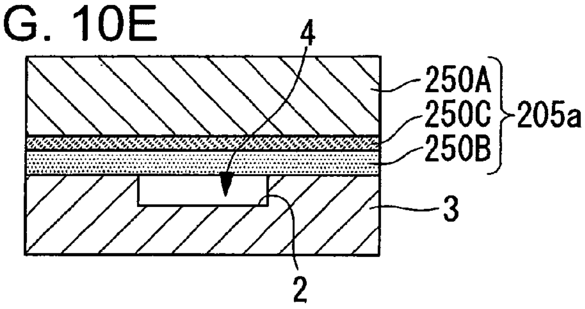
FIG. 10E is a longitudinal sectional view illustrating a bonding step.

Next, as illustrated in FIG. 10E, one face of the supporting substrate 3 where the concave portion 2 is formed and a face of the upper substrate 205*a* on the side of the coating layer 250B are opposed to each other and directly bonded to each other by high-temperature fusion bonding (Step A4, bonding step).

Figure 10F:
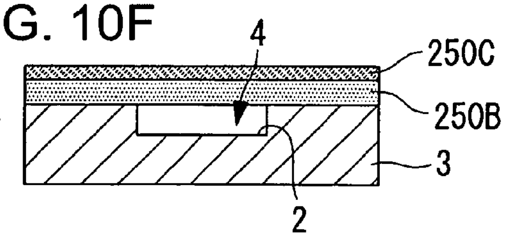
FIG. 10F is a longitudinal sectional view illustrating a first thinning step.

In the thinning steps, a glass etchant is used first to completely etch away the etching layer 250A of the upper substrate 205*a* as illustrated in FIG. 10F (Step C5*a*, first thinning step). The etching in this step is executed after an additional etching time to reach the etching barrier layer 250C (first etching time) is calculated from the thickness dimension of the upper substrate 205*a* that has been measured in advance and from the etching rate of the upper substrate 205*a* that is expected from the etching conditions.

The etching stops advancing further when the etching layer 250A is etched away and the etching barrier layer 250C is reached. The upper substrate 205*a* therefore is not etched any further after the first etching time is reached. A slight over-etching in terms of time, however, absorbs fluctuations generated in previous etching.

Figure 10G:
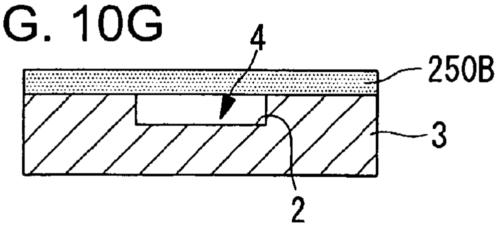
FIG. 10G is a longitudinal sectional view illustrating a second thinning step.

After the etching of the etching layer 250A is finished, an aluminum etchant which differs from the glass etchant is used to remove the etching barrier layer 250C as illustrated in FIG. 10G (Step C5*b*, second thinning step). The etchant for the etching barrier layer 250C hardly erodes the coating layer 250B, and the advance of etching can therefore be stopped at the time when the etching barrier layer 250C is completely etched away and the coating layer 250B is reached. Consequently, the heat storage layer 5 is formed substantially to the target thickness dimension, or within a fluctuation margin from the target thickness dimension (10 μm±3 μm).

This embodiment takes aluminum as an example of the etching barrier layer 250C, but the etching barrier layer 250C can be any substance that is not etched by a glass etchant. For example, metal such as Cu, Cr, or Au, ceramic, or resin may be employed.

This embodiment takes sputtering as an example of the coating method. However, as is the coating method in the manufacturing method B, other methods including CVD, vacuum evaporation, and electroless plating may be employed. For instance, in the case of electroless plating, the original substrate 250 is immersed in a solution containing a metal ion and a reducer, and hence the etching barrier layer 250C that is made of the reduced metal atoms is formed by precipitation on a surface of the original substrate 250.

Embodiments of the present invention have been described in detail with reference to the drawings. However, specific methods and structures of the present invention are not limited to these embodiments, and include design modifications and the like that do not depart from the spirit of the present invention.

For example, in the embodiments described above, the concave portion 2 is formed in the shape of a rectangle stretching along the longitudinal direction of the supporting substrate 3, and hence the hollow portion 4 has an uninterrupted structure that faces all of the heating resistors 7. Alternatively, separate concave portions may be formed along the longitudinal direction of the supporting substrate 3 in places that face the respective heating portions 7A of the heating resistors 7, and hence, together with the heat storage layer 5, each concave portion forms an independent hollow portion. This way, a thermal head having a plurality of separate hollow heat insulating layers is formed.

In the embodiments described above, the heat storage layer 5 hermetically seals the concave portion 2. The concave portion 2 may be left open instead of hermetically sealing the concave portion 2 with the heat storage layer 5. This way, a thermal head having an open-end hollow heat insulating layer is formed.

The supporting substrate 3 and the upper substrate 5*a*, 105*a*, or 205*a*, which are bonded by thermal fusion bonding, may instead be bonded by an adhesive.

A large-sized, rectangular upper substrate and supporting substrate maybe bonded together to create a large number of thermal heads 1. In this case, a plurality of concave portions 2 are formed on one face of the large-sized supporting substrate in the concave portion forming step and, in the heating resistor forming step, one heating resistor 7 is formed for each of the concave portions 2 of the supporting substrate on the upper substrate thinned in the thinning step. The heating resistor forming step is followed by a cutting step, where a thermal head aggregation in which a plurality of heating resistors 7 are formed on the upper substrate is cut into a plurality of thermal heads 1. This way, productivity is improved and the cost is reduced.

What is claimed is:

1. A thermal head manufacturing method, comprising:

a concave portion forming step of forming at least one concave portion on one face of a supporting substrate;

an upper substrate forming step of forming an upper substrate comprised of a first layer and a second layer stacked together in a substrate thickness direction, the first layer having a first etching rate and the second layer having a second etching rate lower than the first etching rate;

a bonding step of bonding the one face of the supporting substrate in which the concave portion has been formed in the concave portion forming step to a surface on a side of the second layer of the upper substrate;

a thinning step of etching the first layer of the upper substrate after the bonding step until the second layer is reached; and a heating resistor forming step of forming at least one heating resistor on the upper substrate which has been thinned in the thinning step so as to be disposed over the concave portion of the supporting substrate.

2. A thermal head manufacturing method according to claim 1; wherein in the upper substrate forming step, the second layer is formed by modifying a composition of part of a substrate made of a material forming the first layer.

3. A thermal head manufacturing method according to claim 1; wherein in the upper substrate forming step, the second layer is formed by coating the second layer on one face of a substrate made of a material forming the first layer.

4. A thermal head manufacturing method according to, claim 1:

wherein in the concave portion forming step, the at least one concave portion comprises a plurality of concave portions formed on the one face of the supporting substrate;

wherein in the heating resistor forming step, the at least one heating resistor comprises a plurality of heating resistors formed on the upper substrate for the respective plurality of the concave portions of the supporting substrate; and further comprising a cutting step of cutting into a plurality of thermal heads a thermal head structure formed by the concave portion forming step, upper substrate forming step, bonding step, thinning step and heating resistor forming step.

5. A thermal head manufacturing method according to claim 1; wherein in the heating resistor forming step, the heating resistor is formed directly on the second layer.

6. A thermal head manufacturing method according to claim 1; wherein the second layer of the upper substrate comprises a heat storage layer; and wherein in the bonding step, the heat storage layer is bonded to the one face of the supporting substrate so as to hermetically seal the concave portion to form between the heat storage layer and the supporting substrate a hollow portion functioning as a heat insulating layer that prevents heat generated by the heating resistor from entering the supporting substrate from the heat storage layer.

7. A thermal head manufacturing method according to claim 1; wherein the upper substrate forming step comprises the step of providing a glass substrate including the first layer of the upper substrate and the step of implanting nitrogen ions into a surface of the glass substrate to a preselected depth from the surface of the glass substrate to form the second layer in stacked relationship to the first layer.

8. A thermal head manufacturing method, comprising:

a concave portion forming step of forming at least one concave portion on one face of a supporting substrate;

an upper substrate forming step of forming an upper substrate comprised of an etching layer, an etching barrier layer, and a coating layer stacked together in a substrate thickness direction, the etching layer being made of a material that is etched by a predetermined etchant, the etching barrier layer being made of a material that is substantially unetched by the predetermined etchant and being disposed adjacent to the etching layer, and the coating layer being made of the same material as the material of the etching layer and being disposed adjacent to the etching barrier layer;

a bonding step of bonding the one face of the supporting substrate in which the concave portion has been formed in the concave portion forming step to a surface on a side of the coating layer of the upper substrate;

a first thinning step of etching the etching layer of the upper substrate after the bonding step until the etching barrier layer is reached;

a second thinning step of removing the etching barrier layer of the upper substrate which has been thinned in the first thinning step; and a heating resistor forming step of forming at least one heating resistor on the upper substrate which has been thinned in the second thinning step so as to be disposed over the concave portion of the supporting substrate.

9. A thermal head manufacturing method according to claim 8:

wherein in the concave portion forming step, the at least one concave portion comprises a plurality of concave portions formed on the one face of the supporting substrate;

wherein in the heating resistor forming step, the at least one heating resistor comprises a plurality of heating resistors formed on the upper substrate for the respective plurality of the concave portions of the supporting substrate; and further comprising a cutting step of cutting into a plurality of thermal heads a thermal head structure formed by the concave portion forming step, upper substrate forming step, bonding step, first thinning step, second thinning step and heating resistor forming step.

10. A thermal head manufacturing method, comprising the steps:

forming at least one concave portion on a surface of a first substrate;

providing a second substrate comprised of a first layer and a second layer that is denser and harder than the first layer;

bonding the first and second substrates to one another so that the second layer of the second substrate covers the concave portion of the first substrate;

etching the first layer of the second substrate until a surface of the second layer of the second substrate is exposed; and forming at least one heating resistor on the exposed surface of the second layer of the second substrate after the etching step so that the heating resistor is disposed over the concave portion of the first substrate.

11. A thermal head manufacturing method according to claim 10; wherein the step of providing the second substrate comprises the step of forming the second layer by modifying a composition of a part of the first substrate so that the modified part is denser and harder than the first layer of the second substrate.

12. A method according to claim 11; wherein the composition of the part of the first substrate is modified by implanting nitrogen ions into the surface of the first substrate to a preselected depth from the surface.

13. A method according to claim 10; wherein the step of providing the second substrate comprises the steps of providing a glass substrate forming the first layer and coating on the glass substrate a layer of a material that is denser and harder than the glass substrate to form the second layer.

14. A method according to claim 10; wherein the step of forming the at least one concave portion comprises the step of forming a plurality of concave portions on the surface of the first substrate; and wherein the step of forming the at least one heating resistor comprises the step of forming a plurality of heating resistors on the second layer of the second substrate after the etching step so that the heating resistors are disposed over the respective concave portions of the first substrate.

15. A thermal head manufacturing method according to claim 10; wherein the second layer of the second substrate comprises a heat storage layer; and wherein in the step of bonding the first and second substrates to one another, the heat storage layer is bonded to the surface of the first substrate so as to hermetically seal the concave portion to form between the heat storage layer and the first substrate a hollow portion functioning as a heat insulating layer that prevents heat generated by the heating resistor from entering the first substrate from the heat storage layer.

* * * * *